United States Patent [19]

Hascal et al.

[11] Patent Number: 4,520,318
[45] Date of Patent: May 28, 1985

[54] ELECTRIC FIELD STRENGTH INDICATOR

[76] Inventors: Marcel Hascal, 183 Robert Hicks Dr., Willowdale, Ontario, Calif.X, M4R 3R3; Donald A. Watson, R.R. #1, Claremont, Ontario, Canada, L0H 1E0; Andrew Danielski, 180 Sherwood Ave., Oshawa, Ontario, Canada, L1G 3L8; Sergio Lopez, 580 Mary St. East, Apt. #113, Whitby, Ontario, Canada, L1N 2R3

[21] Appl. No.: 467,267

[22] Filed: Feb. 17, 1983

[51] Int. Cl.³ .............................................. G01R 29/12
[52] U.S. Cl. ..................................... 324/457; 324/72; 340/661
[58] Field of Search ................. 324/109, 115, 122, 72, 324/72.5, 452, 457, 60 C, 61 P; 340/661, 662

[56] References Cited

U.S. PATENT DOCUMENTS

| 2,482,016 | 9/1949 | McCoy | 324/122 |
| 3,798,541 | 3/1974 | Campbell, Jr. et al. | 324/72.5 |
| 3,829,776 | 8/1974 | Lozoya | 324/122 |
| 4,266,184 | 5/1981 | Devine | 324/72.5 |

FOREIGN PATENT DOCUMENTS

| 591051 | 1/1960 | Canada . | |
| 642506 | 6/1962 | Canada . | |
| 707043 | 3/1965 | Canada . | |
| 792901 | 8/1968 | Canada . | |
| 934822 | 10/1973 | Canada . | |
| 945213 | 4/1974 | Canada . | |
| 1037121 | 8/1978 | Canada . | |
| 511434 | 8/1939 | United Kingdom | 324/457 |

Primary Examiner—Ernest F. Karlsen
Assistant Examiner—Kevin D. O'Shea
Attorney, Agent, or Firm—Ridout & Maybee

[57] ABSTRACT

An electric field strength indicator for use with high voltage conductors comprises a capacitive probe mounted within a tubular shield having an insulating spacer at one end for locating the unit with respect to a conductor under test. The probe is electrically coupled to a signalling circuit and is movable axially within the shield to a position at which a threshold response is obtained. Such position, which denotes the conductor voltage, is read on a scale provided. Because of the shield the device is directional, the probe being shielded from neighboring conductors.

12 Claims, 4 Drawing Figures

ELECTRIC FIELD STRENGTH INDICATOR

This invention relates to an electric field strength indicating device for use in association with high voltage conductors, more particularly the conductors of overhead power transmission lines.

A device in accordance with the invention is used to measure the voltage of an energized power line by detecting and converting the electric field surrounding the line, the device comprising a probe which can be capacitively coupled to the conductor under test while being electrostatically shielded from neighbouring conductors which would affect the response.

According to the invention there is provided an electric field strength indicating device for use in association with high voltage conductors, the device comprises an elongate probe carrier, a probe electrode mounted on said carrier adjacent one end thereof, electrical signalling means coupled to the probe electrode for responding to electrostatically induced voltages thereon, said signalling means being responsive to induced voltages above a predetermined threshold level, a tubular shielding plate surrounding the probe carrier and extending beyond said one end thereof, an insulating spacer fixedly mounted on the tubular shielding plate and extending axially from one end thereof, the spacer having a free end configured to engage a conductor under test for locating the shielding plate with respect to the conductor, means for moving the probe carrier axially within the tubular shielding plate whereby to vary the distance between the probe electrode and the conductor and so position the probe electrode with respect to the conductor to obtain a threshold response, and means for indicating the axial position of the probe electrode within the tubular shielding plate.

Preferably, for use with overhead conductors the device is adapted to be mounted on a switch stick having a universal splined coupling head. Since the electric field strength is defined by the axial position of the probe electrode within the tubular shielding plate at which a threshold response, audible and/or visual, is obtained, the said indicating means are preferably calibrated in terms of conductor voltage.

In order that the invention may be readily understood, one embodiment thereof will now be described, by way of example, with reference to the accompanying drawings. In the drawings.

Figure 1:
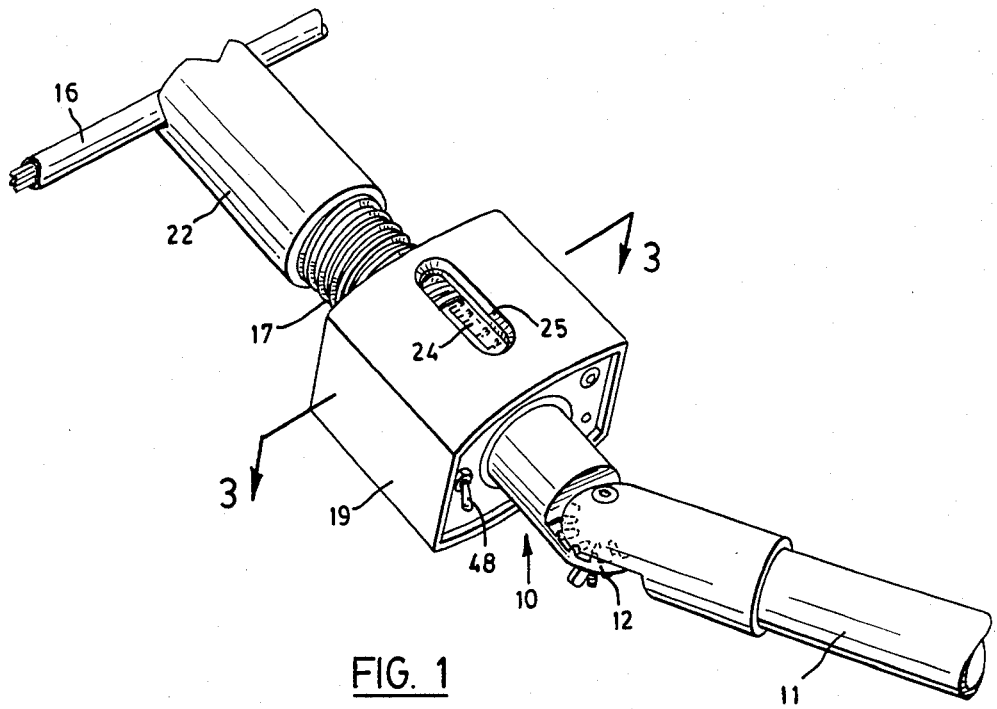
FIG. 1 is a perspective view showing the device applied to a conductor of an overhead power transmission line.
Figure 4:
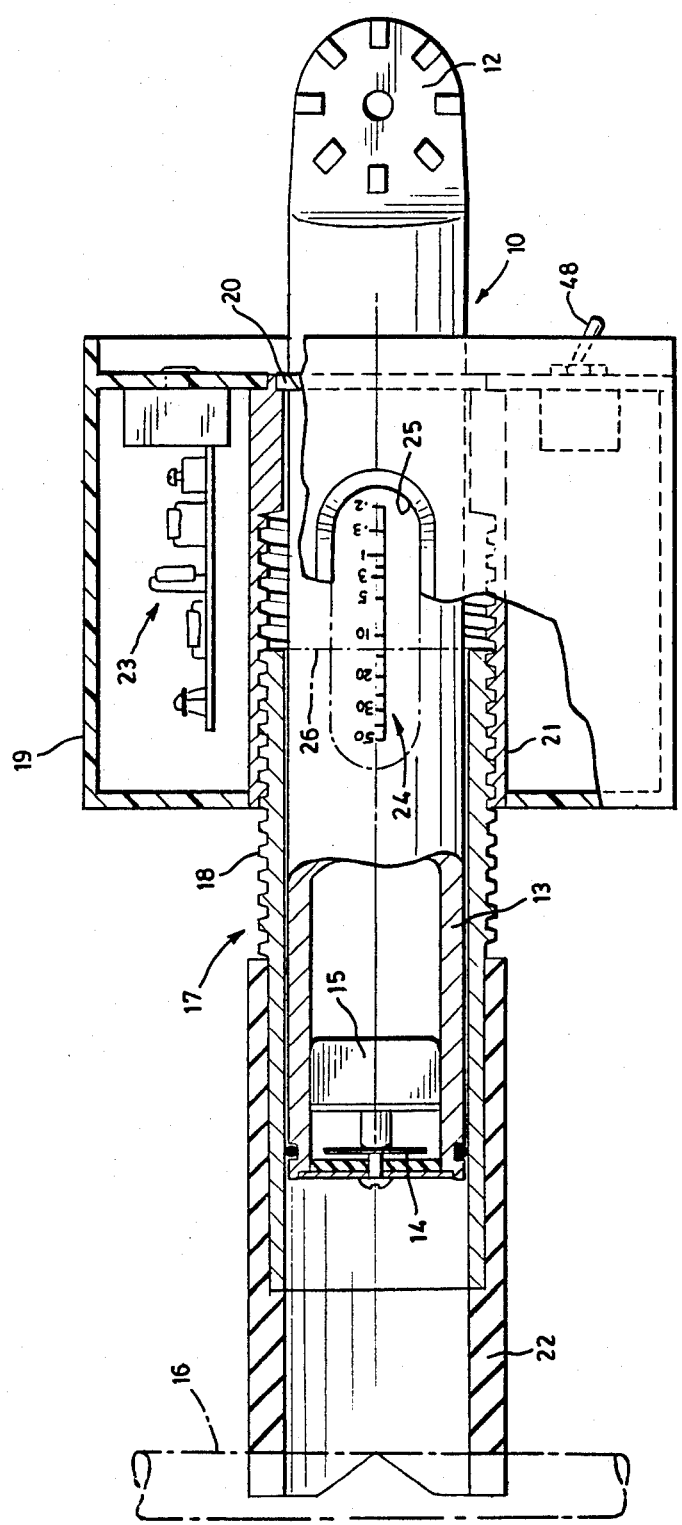
FIG. 4 is a side elevation partly in section taken along the axis of the device.

The physical structure of the device is fully illustrated in FIGS. 1 and 4, FIG. 1 showing the general external appearance of the device when in use and FIG. 4 showing its internal structure. As shown in the figures, the device basically comprises an elongate probe assembly 10 which is coupled at one end to a switch stick 11 by a universal splined coupling 12, the ends of the probe assembly and the switch sticks being formed with respective splined coupling members. The probe assembly 10 comprises a probe carrier in the form of a tubular housing 13 of electrically insulating material, closed at each end, and carrying a probe electrode 14 adjacent one end. The probe electrode 14 is in the form of a flat circular plate mounted on a support 15 coaxially with the tubular housing 13. The probe electrode 14 is adapted to be capacitively coupled to a line conductor 16 under test. The probe carrier 13 and probe electrode 14 are axially movable within a tubular casing 17 which forms a shielding plate extending beyond the probe electrode and said one end of the probe carrier. The tubular shielding plate 17 is externally threaded along a portion of its length, as shown at 18 in FIG. 4.

A casing 19 for the electronic circuitry of the device is rigidly connected to the probe carrier 13 by keying means 20 so as to be rotatable therewith in relation to the tubular shielding plate 17. The casing 19 has an internally threaded hub 21 which is rotatably mounted on the externally threaded portion 18 of the shielding plate 17 so as to be in screw-threaded engagement therewith. Thus, by rotating the unit formed by the probe carrier and casing 19, the unit can be advanced along the tubular shielding plate 17 for varying the distance between the probe electrode 14 and conductor 16.

An insulating spacer comprising a tubular sleeve 22 of insulating material is fixedly mounted on the tubular shielding plate 17 so as to extend axially from the free end thereof. The tubular sleeve 22 is formed at its free end with V-notches, preferably two pairs of diametrically opposed notches, by which the spacer is engaged with the conductor to be tested. The tubular shielding plate is thus located with respect to the conductor and prevented from rotating with the probe unit when the latter is rotated.

Electrical signalling circuitry 23 mounted inside the casing 19 is electrically coupled to the probe electrode 14 for responding to voltages induced thereon when the latter is capacitively coupled to a conductor 16. As will be described, the circuitry is arranged only to respond to induced voltages above a predetermined threshold level, which may be adjusted, to produce a response signal. In order to use the device one adjusts the position of the probe electrode 14 within the shielding plate until a threshold response is received, the position thus being a function of the electrical voltage of the conductor under test. Since the probe electrode moves with the probe carrier and the casing 19 as a unit, the position can be determined by noting the position of the casing 19 with respect to the tubular shielding plate 17. For this purpose the probe carrier housing 13 is marked with a graduated scale 24 along the portion of its length which lies beneath an elongate window 25 in the casing 19. This scale, which is calibrated in terms of line voltage, projects from the tubular shielding plate 17 by an amount which depends upon the position of the probe carrier and electrode carried thereby. The appropriate reading of the scale is thereby given by the end 26 of the shielding plate which serves as a scale marker.

Figure 2:
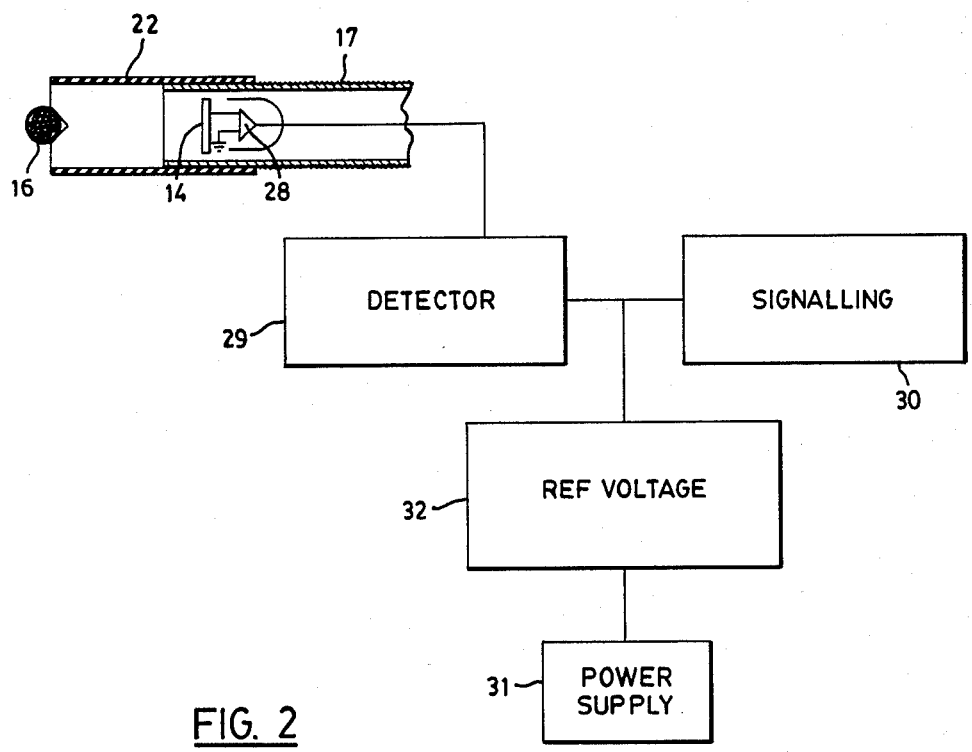
FIG. 2 is a schematic diagram of the device with its ancillary electronic circuitry.

Referring now to FIG. 2, this figure shows schematically the tubular shielding plate 17 with the tubular sleeve 22 fixedly mounted at one end and engaging the conductor 16. The probe electrode 14 is connected via a 60 c/s active filter 28 to a detector circuit 29 which, for signals exceeding a predetermined threshold voltage, actuates a signalling circuit 30. The device is energised from a d.c. power supply 31, a circuit 32 being provided to monitor the supply voltage and to provide a reference voltage.

Figure 3:
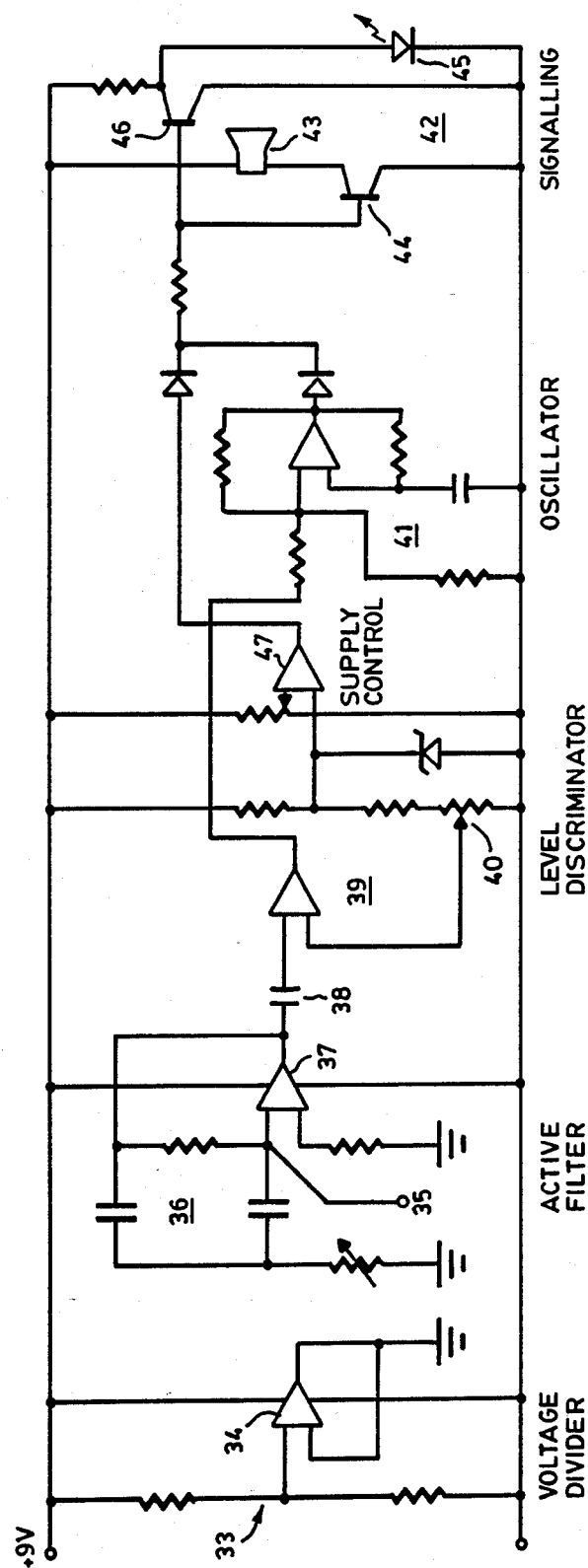
FIG. 3 is a schematic diagram showing the circuitry in greater detail.

FIG. 3 shows these circuit components in greater detail. The power supply is a 9-volt battery connected across a voltage divider circuit 33 including an operational amplifier 34, the latter providing a balanced d.c. output +4.5 volts and −4.5 volts and a virtual ground. The probe electrode 14 (not shown) is connected to an input 35 of a 60 c/s active filter circuit 36 comprising an operational amplifier 37. The output of the latter is connected via a capacitor 38 to the input of a level discriminator circuit 39 which determines the threshold response level of the device and includes a potentiometer 40 for adjusting the threshold response level. The output of the level discriminator circuit is applied to an astable oscillator 41 which energises the signalling circuit 42. The signalling circuit 42 comprises essentially a sounding device 43 with driving transistor 44 for producing an audible signal, and an LED 45 with driving transistor 46 for producing a visual signal. These signals, indicative of a response above the threshold level of the probe system, are intermittent at the frequency of the oscillator 41. However, the supply voltage is also continuously monitored by an operational amplifier 47, the output of which is connected directly to the signalling circuit. The purpose of this monitoring circuit is to ensure that the supply voltage is within preset limits and to produce a continuous signal, if the limits are exceeded, thereby indicating a requirement for battery replacement.

In order to use the device the user must first mount the probe assembly on the universal splined head and then switch the instrument on by the switch 48 (FIGS. 1 and 4). If the unit is operative the LED 45 will turn on and this will be followed by two or three audio bursts. If there is no such response, or if the audio signal is continuous, the battery must be replaced.

When the unit is operative the tubular sleeve 22 and shield 17 unit is rotated until the scale 24 indicates approximately the nominal line voltage. The sleeve 22 is then engaged with the conductor, the probe electrode 14 being shielded from neighbouring conductors by the plate 17. Next the instrument is rotated on the threaded tubular shielding plate, the latter being located by the conductor, until a threshold response is received. The unit is then removed from the conductor and the voltage or field strength can be read directly from the scale.

What we claim is:

1. An electric field strength indicating device for use in association with high voltage conductors, comprising:
    an elongate probe carrier,
    a probe electrode mounted on said carrier adjacent one end thereof,
    electrical signalling means coupled to the probe electrode for responding to electrostatically induced voltages thereon, said signalling means being responsive to induced voltages above a predetermined threshold level,
    a tubular shielding plate surrounding the probe carrier and extending beyond said one end thereof,
    an insulating spacer fixedly mounted on the tubular shielding plate and extending axially from one end thereof, the spacer having a free end configured to engage a conductor under test for locating the shielding plate with respect to the conductor,
    means for moving the probe carrier axially within the tubular shielding plate whereby to vary the distance between the probe electrode and the conductor and so position the probe electrode with respect to the conductor to obtain a threshold response, and
    means for indicating the axial position of the probe electrode within the tubular shielding plate.

2. An indicating device according to claim 1 wherein said means for indicating the axial position of the probe electrode are calibrated in terms of conductor voltage.

3. An indicating device according to claim 1, wherein the probe carrier incorporates a universal splined coupling at the end remote from said one end of the probe carrier for coupling engagement with a universal splined head.

4. An electric field strength indicating device for use in association with high voltage conductors, comprising:
    an elongate probe housing,
    a probe electrode mounted within the probe housing adjacent one end thereof,
    electrical signalling means coupled to the probe electrode for responding to electrostatically induced voltages thereon, said signalling means being responsive to induced voltages above a predetermined threshold level,
    a tubular shielding plate surrounding the probe housing and extending beyond said one end thereof,
    an insulating spacer fixedly mounted on the tubular shielding plate and extending axially from one end thereof, the spacer having a free end providing means to engage a conductor under test for locating the shielding plate with respect to the conductor,
    means for axially moving the probe housing within the tubular shielding plate whereby to vary the distance between the probe electrode and the conductor to obtain a threshold response, and
    means for indicating the axial position of the probe electrode within the tubular shielding plate.

5. An electric field strength indicator according to claim 4, wherein the electrical signalling means includes an audio device for producing an audible response signal.

6. An electric field strength indicator according to claim 5, wherein the electrical signalling means includes means for adjusting said threshold level.

7. An electric field strength indicator for use in association with high voltage conductors, comprising:
    an elongate probe housing,
    a probe electrode mounted within the housing adjacent one end thereof,
    a tubular shielding plate surrounding the probe housing and extending beyond said one end thereof, the tubular shielding plate being externally threaded along a portion of its length,
    a casing having an internally threaded hub rotatably mounted on said externally threaded portion of the shielding plate in screw-threaded engagement therewith, the casing being rigidly connected to the probe housing to form a rotatable unit therewith,
    electrical signalling means within the casing, said signalling means being electrically coupled to the probe electrode for responding to electrostatically induced voltages thereon, said signalling means being responsive to induced voltages above a predetermined threshold level,
    an insulating spacer fixedly mounted on the tubular shielding plate and extending axially from one end thereof, the spacer having a free end providing means to engage a conductor under test for locating the tubular shielding plate with respect to the conductor, means for rotating the probe housing and casing unit with respect to the tubular shielding plate whereby to advance the unit along the shielding plate and so vary the distance between the probe electrode and the conductor under test, and means for indicating the axial position of the probe electrode at which a threshold response is obtained.

8. An electric field strength indicator according to claim 7, wherein the casing is formed with a window, said indicating means being formed by scale markings on the probe housing visible through the window, the scale markings being calibrated in terms of conductor voltage.

9. An electric field strength indicator according to claim 8, wherein the means for rotating said unit comprises a switch stick coupled to the unit by a universal splined coupling.

10. An electric field strength indicator according to claim 9, wherein the electrical signalling means includes an audio device for producing an audible response signal.

11. An electric field strength indicator according to claim 10, wherein the electrical signalling means includes means for adjusting said threshold level.

12. An electric field strength indicator according to claim 8, wherein the insulator spacer comprises a tubular sleeve extending from said one end of the shielding plate, said free end of the sleeve being formed with V-notches for engagement with the conductor to be tested.

* * * * *